US008599296B2

(12) United States Patent
Suzuki et al.

(10) Patent No.: US 8,599,296 B2
(45) Date of Patent: Dec. 3, 2013

(54) CHARGE MULTIPLYING SOLID-STATE IMAGING DEVICE

(75) Inventors: Hisanori Suzuki, Hamamatsu (JP); Yasuhito Yoneta, Hamamatsu (JP); Shin-ichiro Takagi, Hamamatsu (JP); Kentaro Maeta, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/139,855

(22) PCT Filed: Jan. 22, 2010

(86) PCT No.: PCT/JP2010/050819
§ 371 (c)(1),
(2), (4) Date: Jun. 15, 2011

(87) PCT Pub. No.: WO2010/087289
PCT Pub. Date: Aug. 5, 2010

(65) Prior Publication Data
US 2011/0254989 A1    Oct. 20, 2011

(30) Foreign Application Priority Data
Jan. 30, 2009   (JP) ................................. 2009-020200

(51) Int. Cl.
*H04N 5/335* (2011.01)
(52) U.S. Cl.
USPC ......................................... 348/311; 348/308
(58) Field of Classification Search
USPC ................................................. 348/311, 308
See application file for complete search history.

(56) References Cited

U.S. PATENT DOCUMENTS

| 4,316,258 | A  | * | 2/1982 | Berger ............................... 708/3 |
| 7,619,201 | B2 | * | 11/2009 | Hadfield ...................... 250/214.1 |
| 8,054,363 | B2 | * | 11/2011 | Robbins ......................... 348/311 |
| 8,367,999 | B2 | * | 2/2013 | Suzuki et al. ............... 250/208.1 |
| 8,466,498 | B2 | * | 6/2013 | Suzuki et al. .................. 257/223 |
| 2004/0150737 | A1 | * | 8/2004 | Pool et al. ..................... 348/311 |
| 2005/0029553 | A1 | * | 2/2005 | Hynecek ........................ 257/223 |
| 2006/0186363 | A1 | * | 8/2006 | Hazelwood et al. .......... 250/580 |
| 2008/0239129 | A1 | * | 10/2008 | Oshima et al. ................ 348/311 |
| 2011/0024606 | A1 | * | 2/2011 | Suzuki et al. ............... 250/208.1 |
| 2011/0024854 | A1 | * | 2/2011 | Suzuki et al. .................. 257/431 |
| 2011/0031377 | A1 | * | 2/2011 | Suzuki et al. ............... 250/208.1 |
| 2011/0186913 | A1 | * | 8/2011 | Suzuki et al. .................. 257/236 |

FOREIGN PATENT DOCUMENTS

| CN | 101277374 | 10/2008 |
| EP | 1 081 766 | 3/2001 |
| EP | 1 152 469 | 11/2001 |

(Continued)

*Primary Examiner* — Aung S Moe
*Assistant Examiner* — Amy Hsu
(74) *Attorney, Agent, or Firm* — Drinker Biddle & Reath LLP

(57) ABSTRACT

A solid-state imaging device 1 according to one embodiment of the present invention is a charge multiplying solid-state imaging device, and includes an imaging area 10 that generates a charge according to the amount of incident light, an output register unit 20 that receives the charge from the imaging area 10, a multiplication register unit 40 that multiplies the charge from the output register 20, and at least one charge dispersion means 71 that disperses the charge input to the multiplication register unit 40 in a width direction perpendicular to a transfer direction.

4 Claims, 14 Drawing Sheets

(56) References Cited

FOREIGN PATENT DOCUMENTS

| JP | 2002-026306 | 1/2002 |
| JP | 2003-009000 | 1/2003 |
| JP | 2004-523112 | 7/2004 |
| JP | 3862850 | 10/2006 |
| JP | 2008-252790 | 10/2008 |

* cited by examiner

Fig.3
(a)
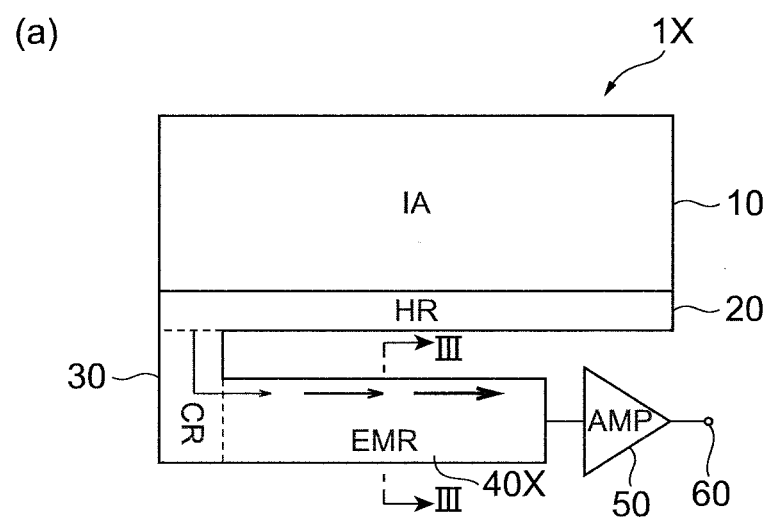
(b)
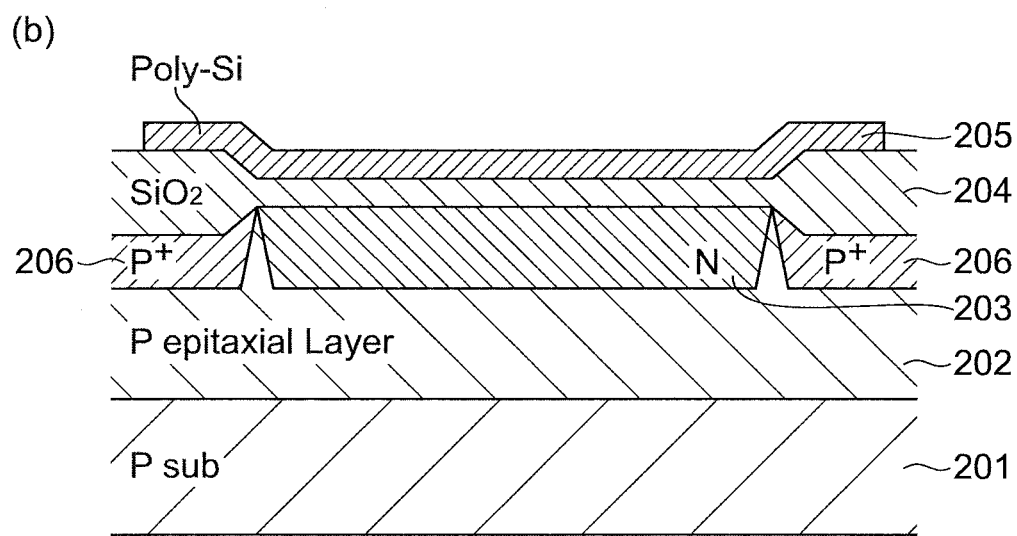

CHARGE MULTIPLYING SOLID-STATE IMAGING DEVICE

TECHNICAL FIELD

The present invention relates to a charge multiplying type of solid-state imaging device such as an EM-CCD.

BACKGROUND ART

Charge-Coupled Devices (CCDs) have been widely known as solid-state imaging devices for taking images of incident light, and among the CCDs, an EM-CCD (Electron Multiplying-CCD) that enables taking an image of weak light has been known. This type of solid-state imaging device includes, in addition to an imaging area that includes a plurality of photodiodes or the like and generates charges according to the amount of incident light and an output register unit that reads out the charges of the imaging area, a multiplication register unit that multiplies the read-out charges, and enables taking an image of weak light by using a charge multiplication effect of the multiplication register unit. This type of solid-state imaging device has been disclosed in Patent Literature 1.

CITATION LIST

Patent Literature

Patent Literature 1: Japanese Patent No. 3862850

SUMMARY OF INVENTION

Technical Problem

Meanwhile, charge has the property of moving the minimum distance of a transfer channel. Therefore, even if the multiplication register unit is formed wide, the charge is concentrated to a part in the width direction of the multiplication register unit, so that charge multiplication is locally performed in the charge register unit. As a result, there may be a case that the charge multiplication efficiency drops, the charge capacity is limited, and a local degradation in multiplication gain occurs.

Therefore, it is an object of the present invention to provide a solid-state imaging device capable of suppressing local concentration of a transfer charge in the multiplication register unit.

Solution to Problem

A solid-state imaging device of the present invention is a charge multiplying solid-state imaging device, and includes an imaging area that generates a charge according to the amount of incident light, an output register unit that receives the charge from the imaging area, a multiplication register unit that multiplies the charge from the output register, and at least one charge dispersion means that disperses the charge input to the multiplication register unit in a width direction perpendicular to a transfer direction.

According to this solid-state imaging device, since a charge input to the multiplication register unit can be dispersed, by the charge dispersion means, in the width direction perpendicular to the transfer direction, local concentration of a transfer charge in the multiplication register unit can be suppressed. Therefore, a drop in the charge multiplication efficiency, a limit in charge capacity, and a local degradation in multiplication gain can be suppressed in the multiplication register unit.

It is preferable that the charge dispersion means described above is formed of a semiconductor region or an insulating region that is disposed at least at an input side in the multiplication register unit, and disposed in a plural number separated from each other in the width direction to hinder charge transfer.

According to this, since the region that hinders charge transfer is disposed in a plural number separated from each other in the width direction of the input side of the multiplication register unit, a charge is led to a plurality of charge transfer channels formed between these regions, that is, to a plurality of charge transfer channels formed dispersed in the width direction. As a result, local concentration of a transfer charge in the multiplication register unit can be suppressed.

Moreover, it is preferable that the solid-state imaging device described above further includes an intermediate register unit disposed between the output register unit and the multiplication register unit, and the charge dispersion means described above is formed of a semiconductor region or an insulating region that is disposed at least at an output side in the intermediate register unit, and disposed in a plural number separated from each other in the width direction to hinder charge transfer.

According to this, since the region that hinders charge transfer is disposed in a plural number separated from each other in the width direction of the output side of the multiplication register unit, a charge is led to a plurality of charge transfer channels formed between these regions, that is, to a plurality of charge transfer channels formed dispersed in the width direction. As a result, a charge dispersed in the width direction is input to the multiplication register unit, and local concentration of a transfer charge in the multiplication register unit can be suppressed.

Moreover, it is preferable that the solid-state imaging device described above further includes an intermediate register unit disposed between the output register unit and the multiplication register unit, and the charge dispersion means described above includes an electrode that is disposed at least at an output side in the intermediate register unit, and disposed at a position with a low charge density in the width direction, and is for increasing a charge induction effect.

According to this, since the electrode to increase a charge induction effect is disposed at the position with a low charge density in the width direction of the output side of the intermediate register unit, when a voltage is applied to this electrode, a charge at a position with a high charge density in the width direction of the output side of the intermediate register unit is led to the position with a low charge density, so that the charge is dispersed in the width direction. As a result, a charge dispersed in the width direction is input to the multiplication register unit, and local concentration of a transfer charge in the multiplication register unit can be suppressed.

Moreover, it is preferable that the charge dispersion means described above includes an electrode that is disposed at least at an input side in the multiplication register unit, and disposed at a position with a low charge density in the width direction, and is for increasing a charge induction effect.

According to this, since the electrode to increase a charge induction effect is disposed at the position with a low charge density in the width direction of the input side of the multiplication register unit, when a voltage is applied to this electrode, a charge at a position with a high charge density in the width direction of the input side of the multiplication register unit is led to the position with a low charge density, so that the charge is dispersed in the width direction. As a result, local concentration of a transfer charge in the multiplication register unit can be suppressed.

Advantageous Effects Of Invention

According to the present invention, in a charge multiplying solid-state imaging device, local concentration of a transfer charge in the multiplication register unit can be suppressed. As a result, a drop in the charge multiplication efficiency, a limit in charge capacity, and a local degradation in multiplication gain can be suppressed in the multiplication register unit.

BRIEF DESCRIPTION OF DRAWINGS

FIG. 3 includes views showing a configuration of a solid-state imaging device of a conventional example, and a sectional view of a multiplication register unit.

DESCRIPTION OF EMBODIMENTS

Figure 1:
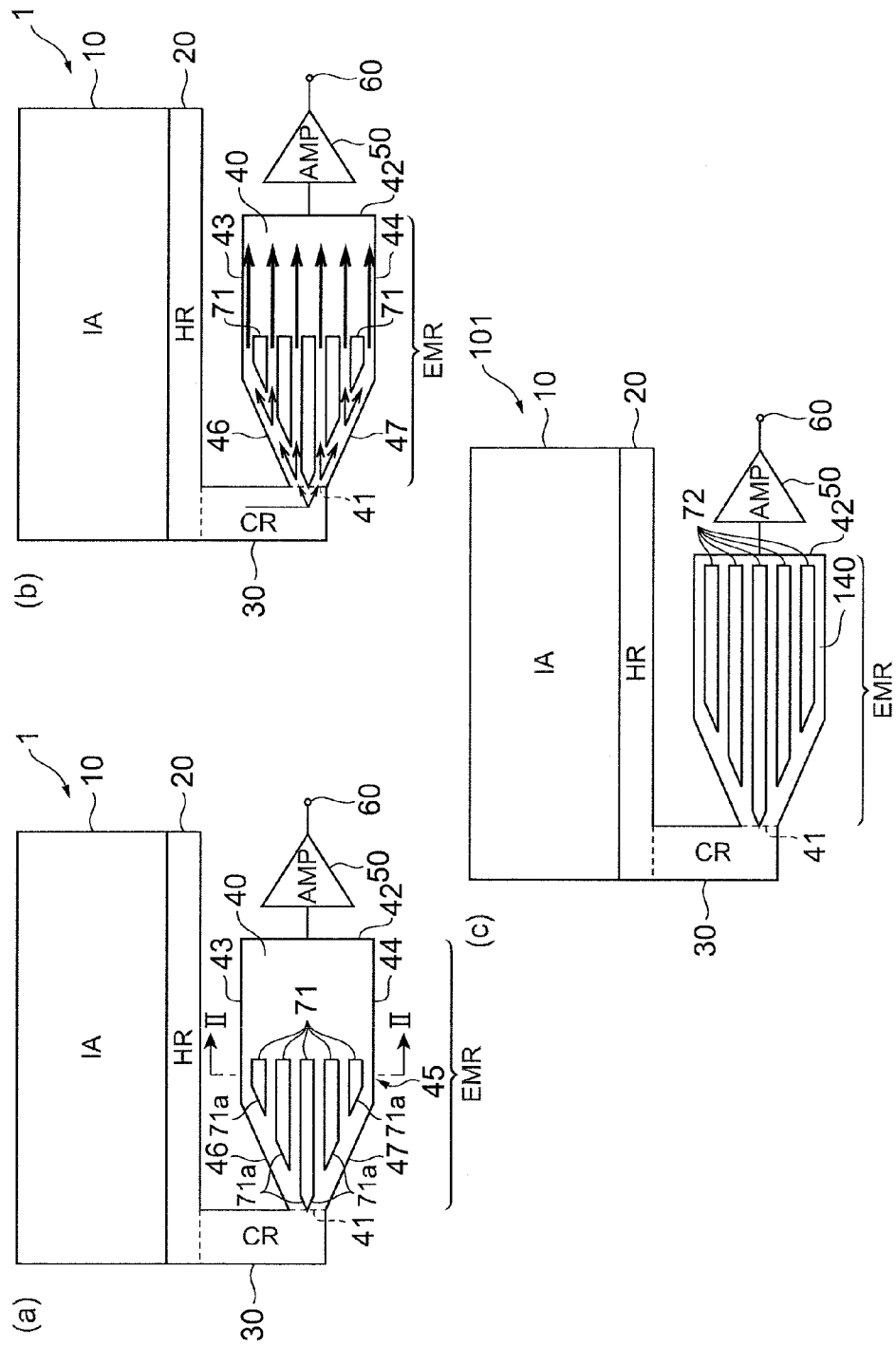
FIG. 1 includes diagrams showing configurations of solid-state imaging devices according to a first embodiment of the present invention.

Hereinafter, preferred embodiments of the present invention will be described in detail with reference to the drawings. Also, the same or corresponding parts will be denoted with the same reference numerals in the drawings.

First Embodiment

FIG. 1 includes diagrams showing configurations of solid-state imaging devices according to a first embodiment of the present invention. The solid-state imaging device 1 shown in FIG. 1(a) includes an imaging area (IA) 10, a horizontal register unit (HR) 20, a corner register unit (CR) 30, a multiplication register unit (EMR) 40, an amplifier (AMP) 50, and an output port 60. Here, the horizontal register unit 20 corresponds to an output register described in the scope of claims, and the corner register unit 30 corresponds to an intermediate register described in the scope of claims.

The imaging area 10 is for taking an image of incident light, and contains a plurality of pixel units. Each pixel unit has a photodiode that generates charge of an amount according to the amount of incident light, and a charge accumulating unit that accumulates the charge. Each pixel unit performs, in response to a clock having a periodic pulsed voltage, in-pixel charge transfer from the photodiode to the charge accumulating unit, charge transfer from the charge accumulating unit to the horizontal register unit 20, and the like.

The horizontal register unit 20 includes a plurality of horizontal registers horizontally arrayed corresponding to every vertical line of the imaging area 10, and in response to a clock having a periodic pulsed voltage, sequentially transfers charges of each horizontal register to the corner register unit 30.

Similar to the horizontal register unit 20, the corner register unit 30 includes a plurality of registers that are connected in series, and in response to a clock having a periodic pulsed voltage, sequentially transfers charges sequentially transferred from the horizontal register unit 20 to the multiplication register unit 40.

The multiplication register unit 40 includes a plurality of multiplication registers, multiplies the charges sequentially transferred from the corner register unit 30, and outputs the charges to the amplifier 50. Each multiplication register causes an energy potential deeper than that for normal transfer to be generated by being applied with a high voltage to its charge transfer channel layer, and uses a charge multiplication effect by an impact ionization effect. Since the charge multiplication effect by an impact ionization effect per one stage of multiplication register is small, the multiplication register unit 40 has approximately several hundred stages of multiplication registers, for example.

The amplifier 50 amplifies as well as converts a charge transferred from the multiplication register unit 40 to a voltage signal, and outputs the signal to the output port 60.

Next, the multiplication register unit 40 will be described in greater detail.

The multiplication register unit 40 exhibits a tapered shape that has a narrow width at an input terminal portion 41, and is gradually increased in width to both side portions 43 and 44 toward an output terminal portion 42. In the present embodiment, a part from the input terminal portion 41 to a middle portion 45 is tapered. A plurality of charge dispersion units 71 are disposed in this tapered part from the input terminal portion 41 to the middle portion 45.

Each of the charge dispersion units 71 extends from the input terminal portion 41 or a tapered surface 46, 47 of the tapered shape to the middle portion 45, and the charge dispersion units 71 are arrayed separated from each other in the width direction perpendicular to a charge transfer direction. One end portion 71a of each charge dispersion unit 71 exhibits a shape along the tapered surface 46, 47, and is separated from the tapered surface 46, 47. The charge dispersion units 71 are made of a semiconductor material having a high resistance or an insulating material having insulating properties, as to be described later. Thus, the charge dispersion units 71 serve as regions that hinder charge transfer.

Accordingly, as shown by the arrows in FIG. 1(b), a charge input from the input terminal portion 41 can be dispersed along the tapered surfaces 46 and 47 toward both side portions 43 and 44, and can be dispersed to a plurality of transfer channels formed dispersed in the width direction, which are transfer channels formed between the charge dispersion units 71. That is, the charge input from the input terminal portion 41 can be uniformly dispersed in the width direction.

In addition, as shown in FIG. 1(c), the charge dispersion units 71 may extend to the vicinity of the output terminal portion 42. That is, a multiplication register unit 140 may have, in place of the charge dispersion units 71, charge dispersion units 72 for which the charge dispersion units 71 extend to the vicinity of the output terminal portion 42 in the multiplication register unit 40, and a solid-state imaging device 101 may include the multiplication register unit 140 in place of the multiplication register unit 40 in the solid-state imaging device 1.

Figure 2:
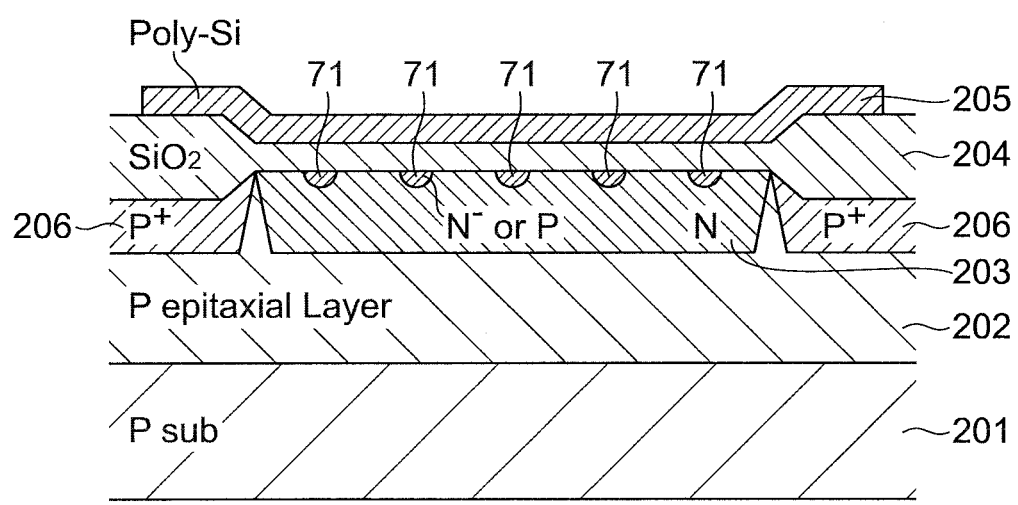
FIG. 2 is a view showing a sectional view taken along a line II-II of FIG. 1(a).

FIG. 2 is a view showing a sectional view taken along a line II-II of FIG. 1(a). As shown in FIG. 2, the multiplication register unit 40 is formed by a polysilicon (Poly-Si) electrode 205 formed on a layered structure for which a p-type epitaxial layer 202, an n-type channel layer 103, and an oxidation film 204 are sequentially stacked on a p-type substrate 201. In addition, a high-concentration p-type layer 206 is formed at both side portions 43 and 44 of the multiplication register unit 40, which are both side portions of the n-type channel layer 203. Here, the n-type channel layer 203 is a charge transfer channel, where charge multiplication is to be performed.

At a side of the n-type channel layer 203 closer to the electrode 205, a plurality of charge dispersion units 71 are formed. The charge dispersion units 71 are formed of high-concentration n-type channel stop regions by dispersion of impurities. That is, the charge dispersion units 71 are formed of regions that have a high resistance and hinder charge transfer. In addition, to the charge dispersion units 71, p-type channel stop regions may be applied, or isolation regions having insulating properties may be applied.

Here, advantageous effects of the solid-state imaging device 1 of the first embodiment will be described in comparison with a solid-state imaging device of a conventional example shown in FIG. 3. FIG. 3(a) is a view showing a configuration of a solid-state imaging device of a conventional example, and FIG. 3(b) is a sectional view taken along a line shown in FIG. 3(a).

The solid-state imaging device 1X shown in FIG. 3 is different from the first embodiment in including a multiplication register unit 40X in place of the multiplication register unit 40 in the solid-state imaging device 1. The multiplication register unit 40X is different from the multiplication register unit 40 in the configuration exhibiting a substantially rectangular shape and having no charge dispersion units 71.

Here, charge has the property of moving the minimum distance of a transfer channel. Particularly, this property is remarkable in such a case of high-speed transfer before being spread by mutual charge repulsion as in the present embodiment. Moreover, since there is a corner, the potential is high inside the corner to produce a curve along the inside of the corner. Therefore, even if the multiplication register unit 40X is formed wide, the charge is concentrated to a part in the width direction of the multiplication register unit 40X, so that charge multiplication is locally performed in the charge register unit 40X (the arrow part in FIG. 3(a)). As a result, there may be a case that the charge multiplication efficiency drops, the charge capacity is limited, and a local degradation in multiplication gain occurs.

However, according to the solid-state imaging device 1 of the first embodiment, since a charge input to the multiplication register unit 40 can be dispersed, by the charge dispersion units 71, in the width direction perpendicular to the transfer direction, local concentration of a transfer charge in the multiplication register unit 40 can be suppressed. Therefore, a drop in the charge multiplication efficiency, a limit in charge capacity, and a local degradation in multiplication gain can be suppressed in the multiplication register unit 40.

Moreover, also in the solid-state imaging device 101 of a modification of the first embodiment, similar advantages to those of the solid-state imaging device 1 of the first embodiment can be obtained.

Second Embodiment

Figure 4:
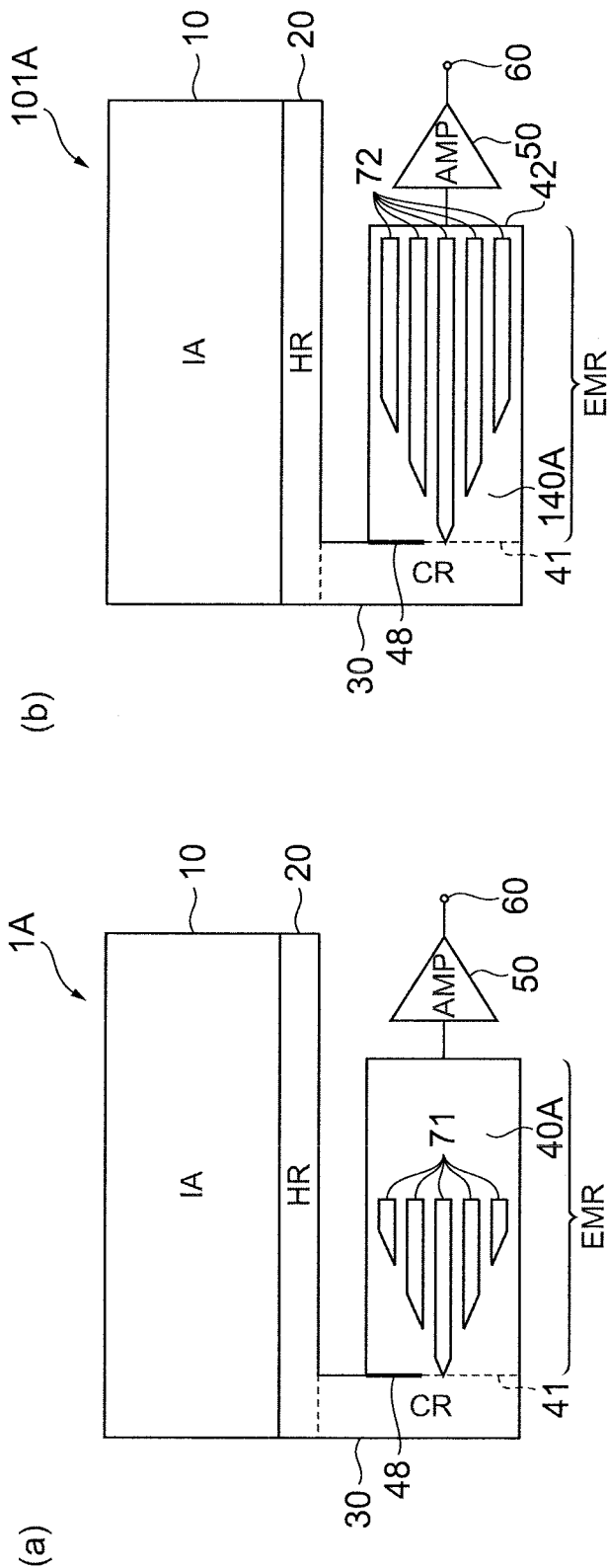
FIG. 4 includes diagrams showing configurations of solid-state imaging devices according to a second embodiment of the present invention.

FIG. 4 includes diagrams showing configurations of solid-state imaging devices according to a second embodiment of the present invention. The solid-state imaging device 1A shown in FIG. 4(a) is different from the first embodiment in an aspect of the configuration including a multiplication register unit 40A in place of the multiplication register unit 40 in the solid-state imaging device 1. Other aspects of the configuration of the solid-state imaging device 1A are the same as those of the solid-state imaging device 1.

The multiplication register unit 40A is different from the multiplication register unit 40 in exhibiting a substantially rectangular shape in the multiplication register unit 40. Moreover, the multiplication register unit 40A is also different from the multiplication register unit 40 in having a wall 48. Other aspects of the configuration of the multiplication register unit 40A are the same as those of the multiplication register unit 40.

The wall 48 is formed at an approximately half part of a side closer to the horizontal register 20 in the input terminal portion 41 of the multiplication register unit 40A. The same material as that of the charge dispersion units 71 can be applied to the material of the wall 48. Accordingly, charge can be led to a substantially central part of the input terminal portion 41, so that similar advantageous effects to those of the multiplication register unit 40 can be obtained.

In addition, as shown in FIG. 4(b), the charge dispersion units 71 may extend to the vicinity of the output terminal portion 42. That is, a multiplication register unit 140A may have, in place of the charge dispersion units 71, charge dispersion units 72 for which the charge dispersion units 71 extend to the vicinity of the output terminal portion 42 in the multiplication register unit 40A, and a solid-state imaging device 101A may include the multiplication register unit 140A in place of the multiplication register unit 40A in the solid-state imaging device 1A.

Also in the solid-state imaging device 1A of the second embodiment and the solid-state imaging device 101A of a modification of the second embodiment, the same advantages as those of the solid-state imaging device 1 of the first embodiment can be obtained.

Third Embodiment

Figure 5:
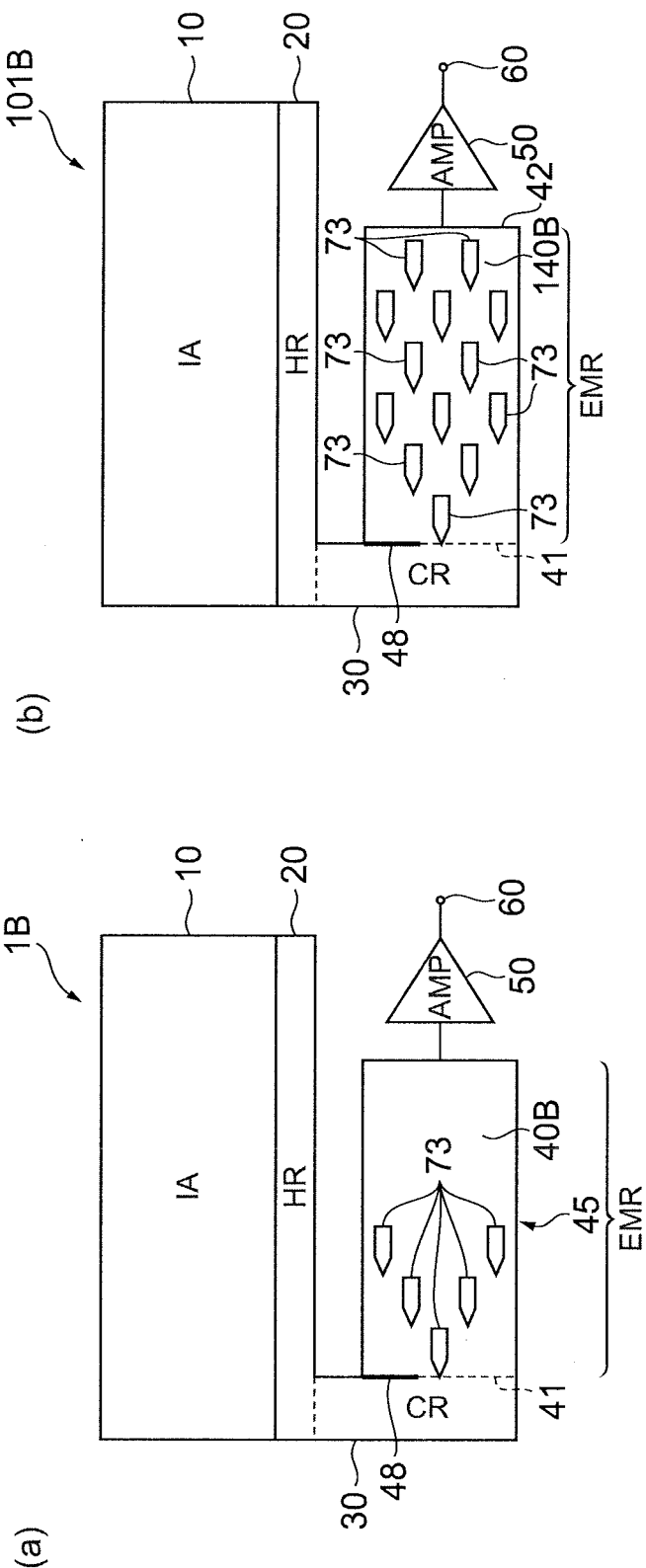
FIG. 5 includes diagrams showing configurations of solid-state imaging devices according to a third embodiment of the present invention.

FIG. 5 includes diagrams showing configurations of solid-state imaging devices according to a third embodiment of the present invention. The solid-state imaging device 1B shown in FIG. 5(a) is different from the second embodiment in an aspect of the configuration including a multiplication register unit 40B in place of the multiplication register unit 40A in the solid-state imaging device 1A. Other aspects of the configuration of the solid-state imaging device 1B are the same as those of the solid-state imaging device 1A.

The multiplication register unit 40B is different from the multiplication register unit 40A in that the charge dispersion units 71 do not extend to the middle portion 45 in the multiplication register unit 40A, that is, in having a plurality of charge dispersion units 73 shorter in length than the charge dispersion units 71. Other aspects of the configuration of the multiplication register unit 40B are the same as those of the multiplication register unit 40A.

In addition, as shown in FIG. 5(b), for the multiplication register unit 40B, the charge dispersion unit 73 may be arrayed in a plural number separated from each other from the input terminal portion 41 toward the output terminal portion 42. That is, a multiplication register unit 140B may, in the multiplication register unit 40B, have a plurality of charge dispersion units 73 arrayed in the charge transfer direction as well as the width direction, and a solid-state imaging device 101B may include the multiplication register unit 140B in place of the multiplication register unit 40B in the solid-state imaging device 1B.

Here, the charge dispersion units 73 neighboring in the charge transfer direction are disposed so as not to overlap with each other in the charge transfer direction. Accordingly, a charge that has arrived transferred between the charge dispersion units 73 of a former stage can be dispersed by the charge dispersion units 73 of a latter stage. Thus, a charge input from the input terminal unit 41 is, by being dispersed into two parts at every charge dispersion unit 73, gradually uniformly dispersed in the width direction.

Also in the solid-state imaging device 1B of the third embodiment and the solid-state imaging device 101B of a modification of the third embodiment, the same advantages as those of the solid-state imaging device 1A of the second embodiment can be obtained.

Fourth Embodiment

Figure 6:
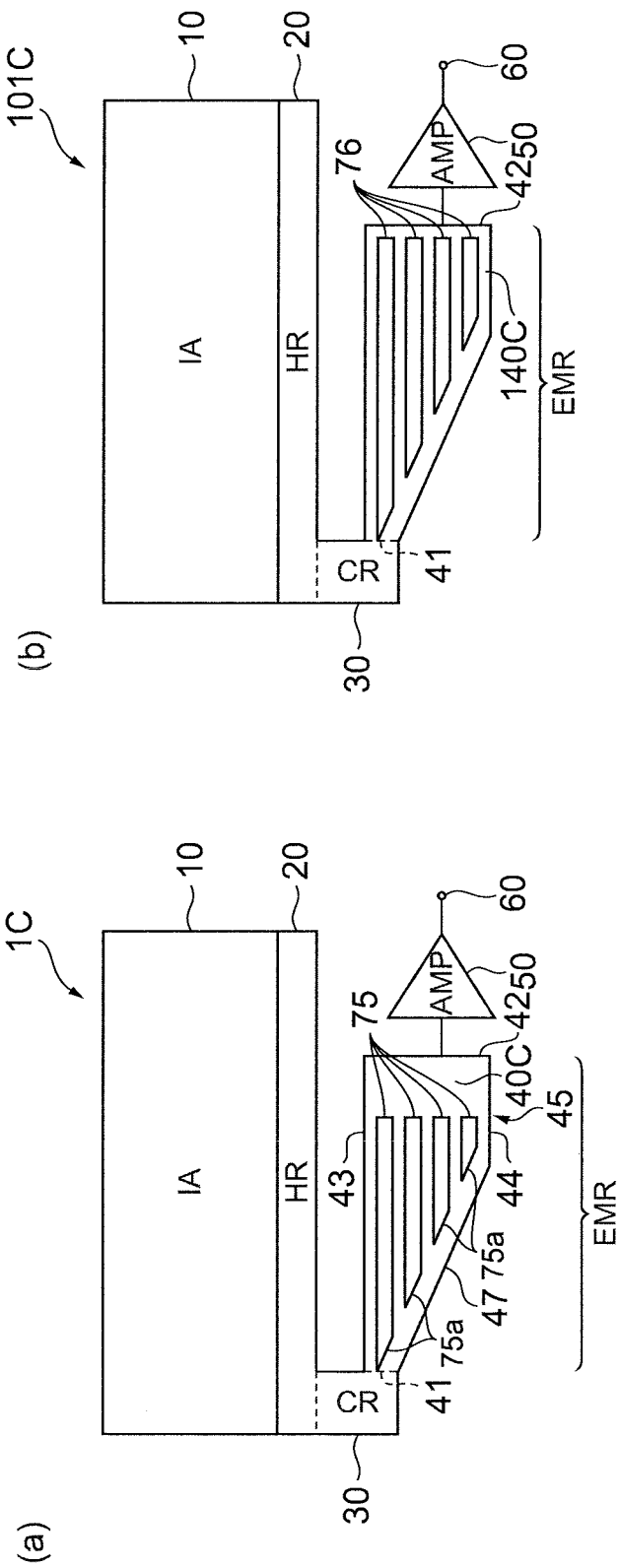
FIG. 6 includes diagrams showing configurations of solid-state imaging devices according to a fourth embodiment of the present invention.

FIG. 6 includes diagrams showing configurations of solid-state imaging devices according to a fourth embodiment of the present invention. The solid-state imaging device 1C shown in FIG. 6(a) is different from the first embodiment in an aspect of the configuration including a multiplication register unit 40C in place of the multiplication register unit 40 in the solid-state imaging device 1. Other aspects of the configuration of the solid-state imaging device 1C are the same as those of the solid-state imaging device 1.

The multiplication register unit 40C exhibits a tapered shape that has a narrow width at the input terminal portion 41, and is gradually increased in width to one side portion 44 toward the output terminal portion 42. In the present embodiment, a part from the input terminal portion 41 to the middle portion 45 is tapered. A plurality of charge dispersion units 75 are disposed in this tapered part from the input terminal portion 41 to the middle portion 45.

Each of the charge dispersion units 75 extends from the input terminal portion 41 or a tapered surface 47 of the tapered shape to the middle portion 45, and the charge dispersion units 75 are arrayed separated from each other in the width direction. One end portion 75a of each charge dispersion unit 75 exhibits a shape along the tapered surface 47, and is separated from the tapered surface 47. The same material as that of the charge dispersion units 71 is applied to the charge dispersion units 75.

Accordingly, a charge input from the input terminal portion 41 can be dispersed along the tapered surface 47 toward one side portion 44, and can be dispersed to a plurality of transfer channels formed dispersed in the width direction, which are transfer channels formed between the charge dispersion units 75. That is, the charge input from the input terminal portion 41 can be uniformly dispersed in the width direction.

In addition, as shown in FIG. 6(b), the charge dispersion units 75 may extend to the vicinity of the output terminal portion 42. That is, a multiplication register unit 140C may have, in place of the charge dispersion units 75, charge dispersion units 76 for which the charge dispersion units 75 extend to the vicinity of the output terminal portion 42 in the multiplication register unit 40C, and a solid-state imaging device 101C may include the multiplication register unit 140C in place of the multiplication register unit 40C in the solid-state imaging device 1C.

Also in the solid-state imaging device 1C of the fourth embodiment and the solid-state imaging device 101C of a modification of the fourth embodiment, the same advantages as those of the solid-state imaging device 1 of the first embodiment can be obtained.

Fifth Embodiment

Figure 7:
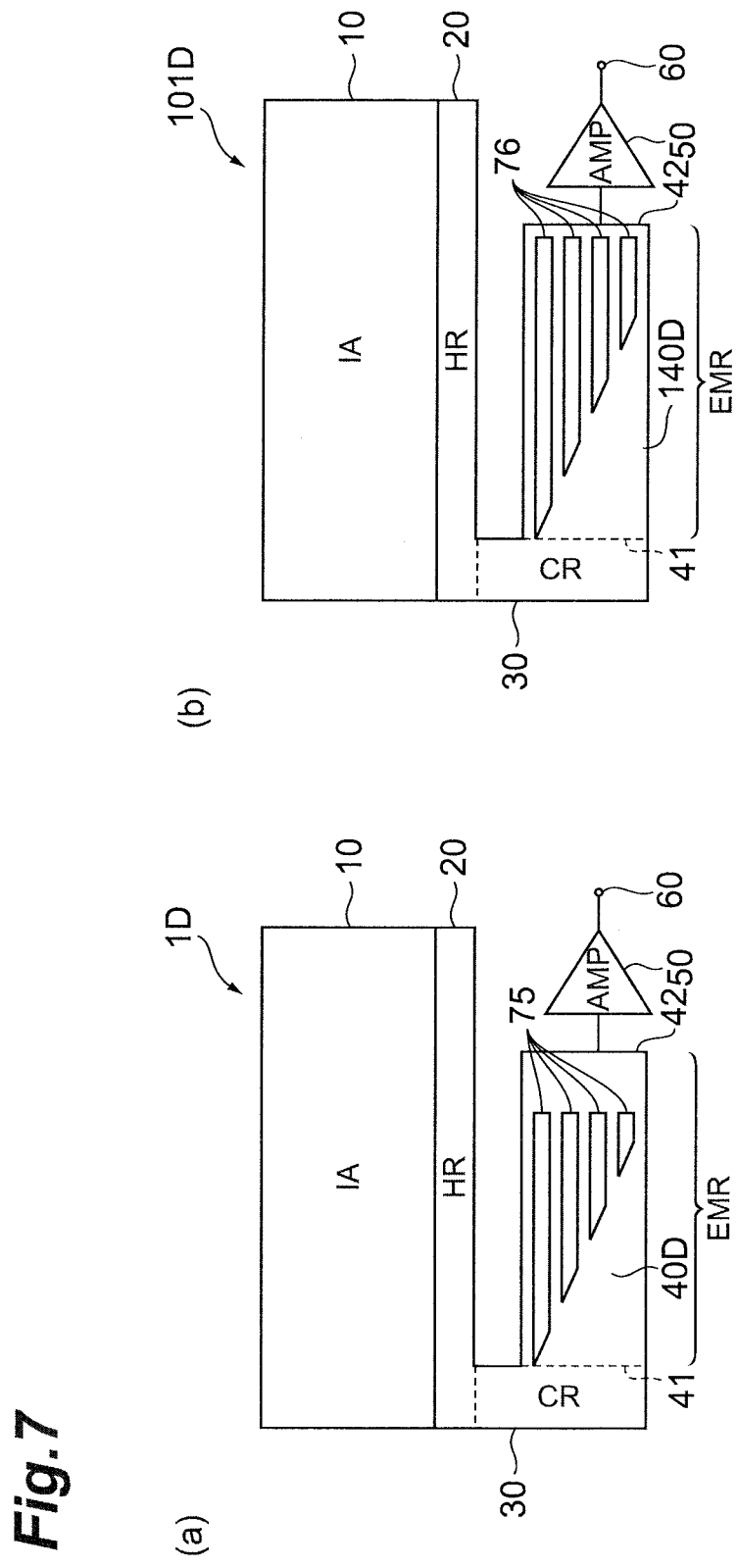
FIG. 7 includes diagrams showing configurations of solid-state imaging devices according to a fifth embodiment of the present invention.

FIG. 7 includes diagrams showing configurations of solid-state imaging devices according to a fifth embodiment of the present invention. The solid-state imaging device 1D shown in FIG. 7(a) is different from the fourth embodiment in an aspect of the configuration including a multiplication register unit 40D in place of the multiplication register unit 40C in the solid-state imaging device 1C. Other aspects of the configuration of the solid-state imaging device 1D are the same as those of the solid-state imaging device 1C.

The multiplication register unit 40D is different from the multiplication register unit 40C in exhibiting a substantially rectangular shape in the multiplication register unit 40C. Other aspects of the configuration of the multiplication register unit 40D are the same as those of the multiplication register unit 40C.

In addition, as shown in FIG. 7(b), the charge dispersion units 75 may extend to the vicinity of the output terminal portion 42. That is, a multiplication register unit 140D may have, in place of the charge dispersion units 75, charge dispersion units 76 for which the charge dispersion units 75 extend to the vicinity of the output terminal portion 42 in the multiplication register unit 40D, and a solid-state imaging device 101D may include the multiplication register unit 140D in place of the multiplication register unit 40D in the solid-state imaging device 1D.

Also in the solid-state imaging device 1D of the fifth embodiment and the solid-state imaging device 101D of a modification of the fifth embodiment, the same advantages as those of the solid-state imaging device 1C of the fourth embodiment can be obtained.

Sixth Embodiment

Figure 8:
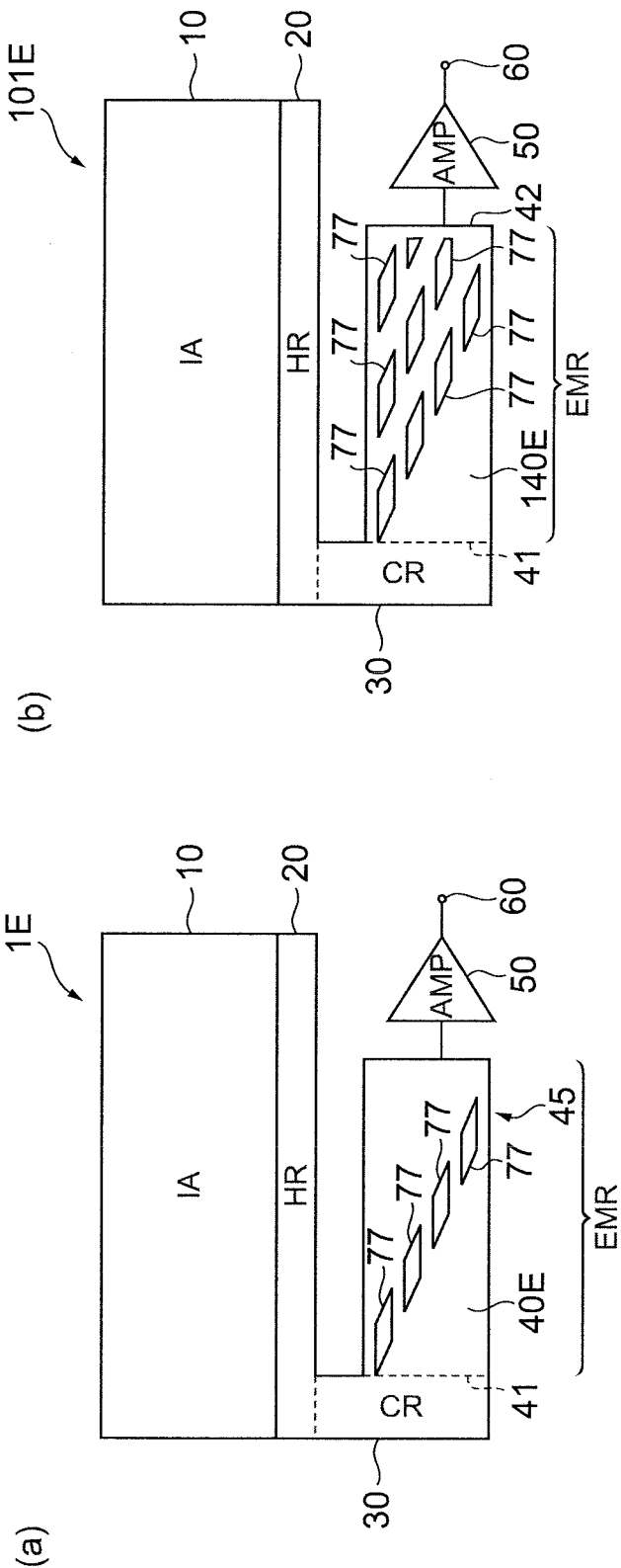
FIG. 8 includes diagrams showing configurations of solid-state imaging devices according to a sixth embodiment of the present invention.

FIG. 8 includes diagrams showing configurations of solid-state imaging devices according to a sixth embodiment of the present invention. The solid-state imaging device 1E shown in FIG. 8(a) is different from the fifth embodiment in an aspect of the configuration including a multiplication register unit 40E in place of the multiplication register unit 40D in the solid-state imaging device 1D. Other aspects of the configuration of the solid-state imaging device 1E are the same as those of the solid-state imaging device 1D.

The multiplication register unit 40E is different from the multiplication register unit 40D in that the charge dispersion units 75 do not extend to the middle portion 45 in the multiplication register unit 40D, that is, in having a plurality of charge dispersion units 77 shorter in length than the charge dispersion units 75. Other aspects of the configuration of the multiplication register unit 40E are the same as those of the multiplication register unit 40D.

In addition, as shown in FIG. 8(b), for the multiplication register unit 40E, the charge dispersion unit 77 may be arrayed in a plural number separated from each other from the input terminal portion 41 toward the output terminal portion 42. That is, a multiplication register unit 140E may, in the multiplication register unit 40E, have a plurality of charge dispersion units 77 arrayed in the charge transfer direction as well as the width direction, and a solid-state imaging device 101E may include the multiplication register unit 140E in place of the multiplication register unit 40E in the solid-state imaging device 1E.

Also in the solid-state imaging device 1E of the sixth embodiment and the solid-state imaging device 101E of a modification of the sixth embodiment, the same advantages as those of the solid-state imaging device 1D of the fifth embodiment can be obtained.

Seventh Embodiment

Figure 9:
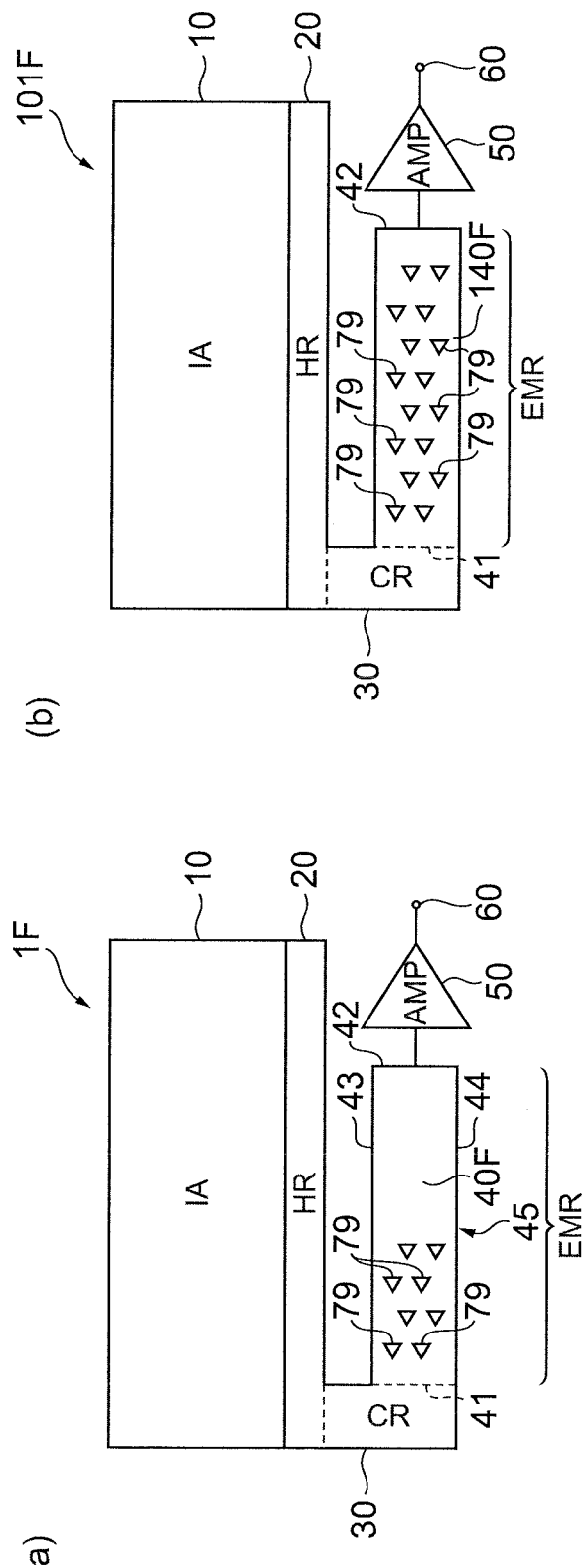
FIG. 9 includes diagrams showing configurations of solid-state imaging devices according to a seventh embodiment of the present invention.

FIG. 9 includes diagrams showing configurations of solid-state imaging devices according to a seventh embodiment of the present invention. The solid-state imaging device 1F shown in FIG. 9(a) is different from the fifth embodiment in an aspect of the configuration including a multiplication register unit 40F in place of the multiplication register unit 40D in the solid-state imaging device 1D. Other aspects of the configuration of the solid-state imaging device 1F are the same as those of the solid-state imaging device 1D.

The multiplication register unit 40F is different from the multiplication register unit 40D in including a plurality of charge dispersion units 79 in place of the charge dispersion units 75 in the multiplication register unit 40D. Each charge dispersion unit 79 exhibits a substantially rectangular shape, and the charge dispersion units 79 are arrayed separated from each other in the width direction of the multiplication register unit 40F. In addition, each charge dispersion unit 79 may be in a substantially polygonal shape without being limited to a substantially triangular shape. Moreover, the charge dispersion units 79 are arrayed separated from each other from the input terminal portion 41 toward the middle portion 45. That is, the charge dispersion units 79 are disposed, in the multiplication register unit 40F, at approximately half of the side closer to the input terminal portion 41. The same material as that of the charge dispersion units 71 can be applied to the charge dispersion units 79.

Here, the charge dispersion units 79 neighboring in the charge transfer direction are disposed so as not to overlap with each other in the charge transfer direction. Accordingly, a charge that has arrived transferred between the charge dispersion units 79 of a former stage can be dispersed by the charge dispersion units 79 of a latter stage. Thus, a charge input from the input terminal unit 41 is, by being dispersed into two parts at every charge dispersion unit 79, gradually uniformly dispersed in the width direction.

In addition, as shown in FIG. 9(b), for the multiplication register unit 40F, the charge dispersion unit 79 may be arrayed in a plural number separated from each other from the input terminal portion 41 toward the output terminal portion 42. That is, a multiplication register unit 140F may, in the multiplication register unit 40F, have a plurality of charge dispersion units 79 arrayed separated as a whole from each other, and a solid-state imaging device 101F may include the multiplication register unit 140F in place of the multiplication register unit 40F in the solid-state imaging device 1F. Moreover, as described above, it is preferable that the charge dispersion units 79 neighboring in the charge transfer direction are disposed so as not to overlap with each other in the charge transfer direction.

Also in the solid-state imaging device 1F of the seventh embodiment and the solid-state imaging device 101F of a modification of the seventh embodiment, the same advantages as those of the solid-state imaging device 1D of the fifth embodiment can be obtained.

Eighth Embodiment

Figure 10:
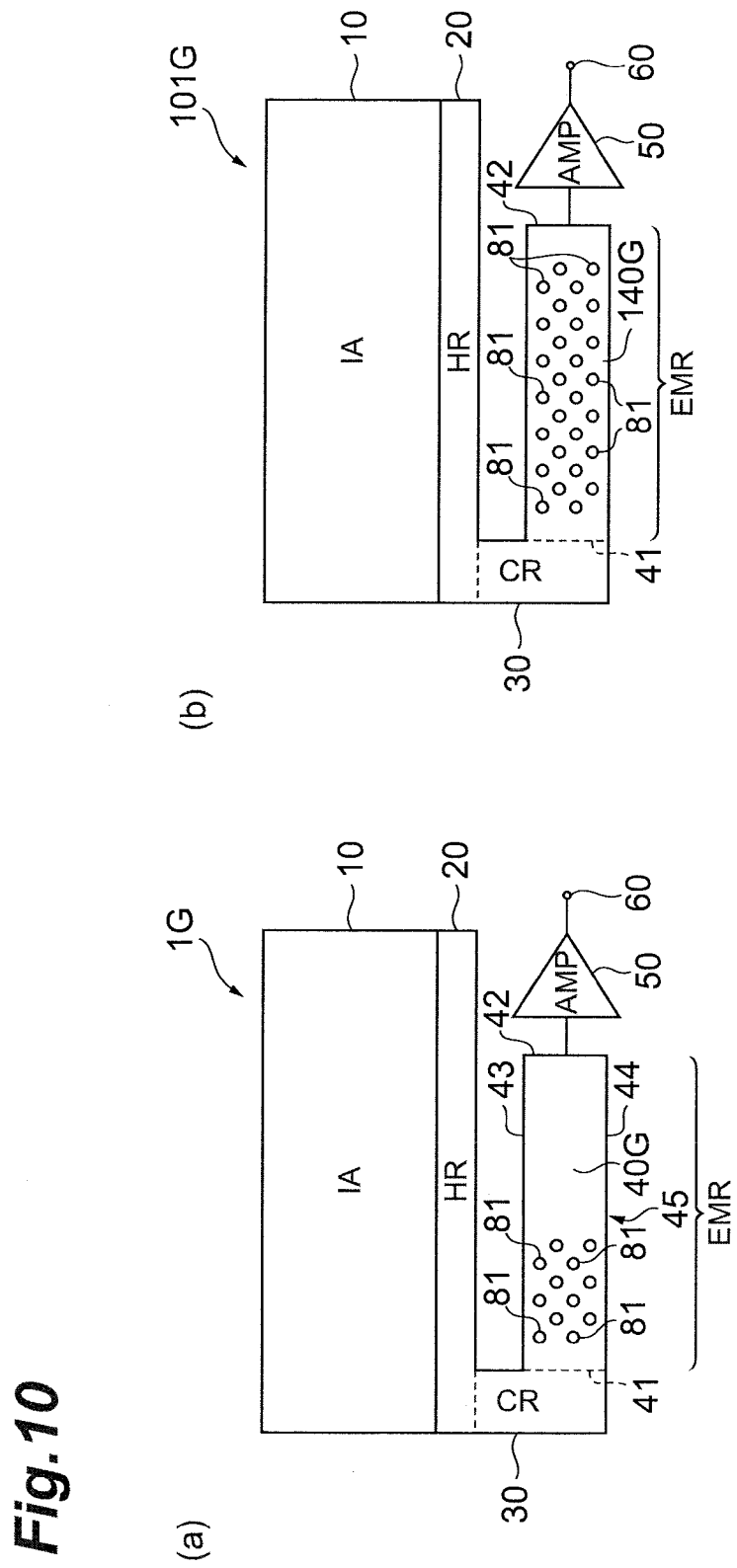
FIG. 10 includes diagrams showing configurations of solid-state imaging devices according to an eighth embodiment of the present invention.

FIG. 10 includes diagrams showing configurations of solid-state imaging devices according to an eighth embodiment of the present invention. The solid-state imaging device 1G shown in FIG. 10 is different from the seventh embodiment in an aspect of the configuration including a multiplication register unit 40G in place of the multiplication register unit 40F in the solid-state imaging device 1F. Other aspects of the configuration of the solid-state imaging device 1G are the same as those of the solid-state imaging device 1F.

The multiplication register unit 40G is different from the multiplication register unit 40F in including a plurality of charge dispersion units 81 each exhibiting a substantially circular shape in place of the charge dispersion units 79 in the multiplication register unit 40F. Other aspects of the configuration of the multiplication register unit 40G are the same as those of the multiplication register unit 40F.

Also in the solid-state imaging device 1G of the eighth embodiment and the solid-state imaging device 101G of a modification of the eighth embodiment, the same advantages as those of the solid-state imaging device 1F of the seventh embodiment can be obtained.

Ninth Embodiment

So far, modes of providing at, at least, the input terminal portion side in the multiplication register unit have been exemplified, but charge dispersion means may be provided at a previous stage of the multiplication register unit.

Figure 11:
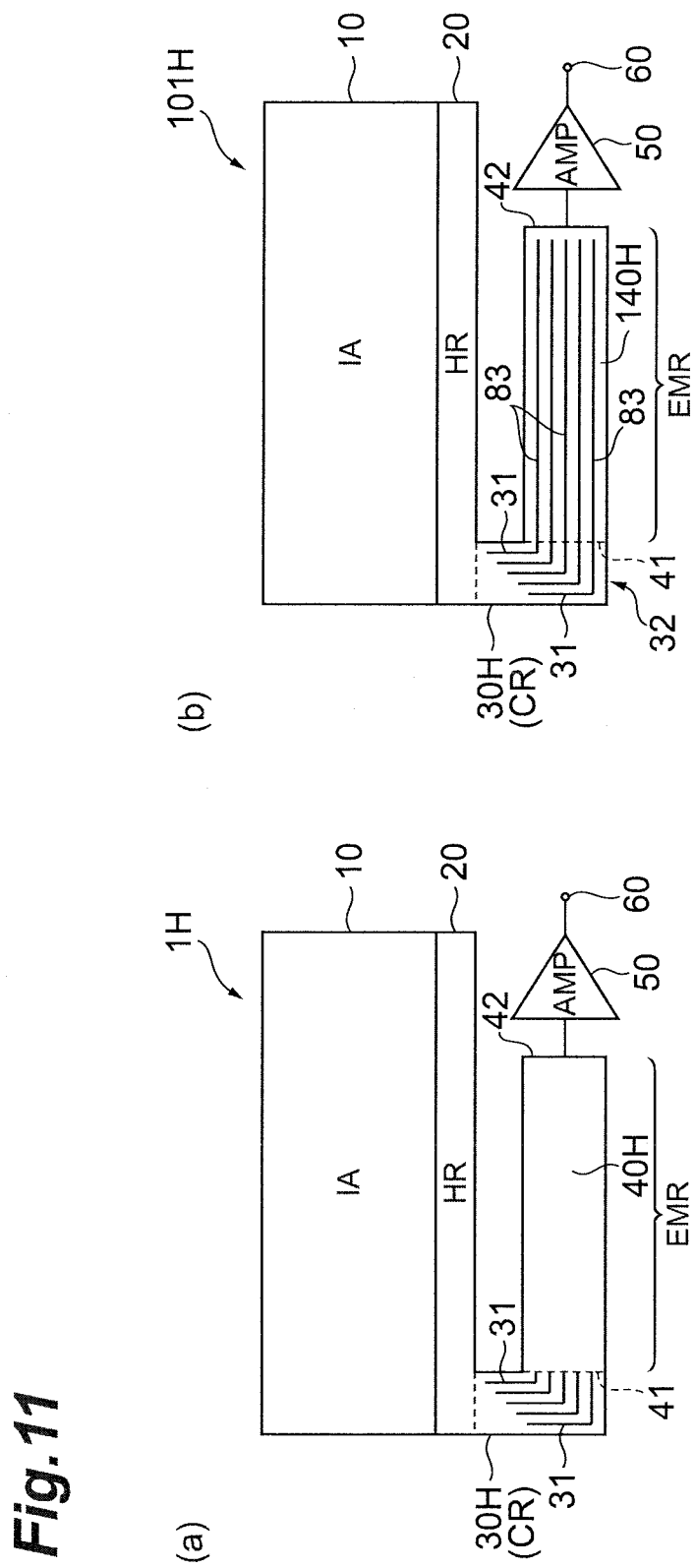
FIG. 11 includes diagrams showing configurations of solid-state imaging devices according to a ninth embodiment of the present invention.

FIG. 11 includes diagrams showing configurations of solid-state imaging devices according to a ninth embodiment of the present invention. The solid-state imaging device 1H shown in FIG. 11(a) is different from the first embodiment in an aspect of the configuration including a corner register unit 30H and a multiplication register unit 40H in place of the corner register unit 30 and the multiplication register unit 40 in the solid-state imaging device 1. Other aspects of the configuration of the solid-state imaging device 1H are the same as those of the solid-state imaging device 1.

The corner register unit 30H is different from the corner register unit 30 in having a plurality of charge dispersion units 31 in the corner register unit 30. The charge dispersion units 31 extend in the charge transfer direction at the side of an output portion 32 in the corner register unit 30H, and are arrayed separated from each other in the width direction. The same material as that of the charge dispersion units 71 can be applied to the charge dispersion units 31.

On the other hand, the multiplication register unit 40H is a normal multiplication register unit not having the above-described charge dispersion units. In addition, as shown in FIG. 11(b), a plurality of charge dispersion units 83 may be formed so as to extend the charge dispersion units 31 in the multiplication register unit 40H. That is, a multiplication register unit 140H may, in the multiplication register unit 40H, have the charge dispersion units 83 extended from the input terminal portion 41 to the vicinity of the output terminal unit 42 and disposed separated from each other in the width direction, and a solid-state imaging device 101H may include the multiplication register unit 140H in place of the multiplication register unit 40H in the solid-state imaging device 1H.

In the solid-state imaging device 1H of the ninth embodiment and the solid-state imaging device 101H of a modification of the ninth embodiment, a charge to be input to the multiplication register unit 40H is dispersed in the width direction by the charge dispersion units 31 at the side of the output unit 32 of the corner register unit 30H located at a previous stage of the multiplication register unit 40H. Therefore, also in the solid-state imaging device 1H of the ninth embodiment, similar advantages to those of the solid-state imaging device 1 of the first embodiment can be obtained.

Further, in the solid-state imaging device 101H of a modification of the ninth embodiment, a charge dispersion effect of the charge dispersion units 31 of the corner register unit 30H described above can be retained by the charge dispersion units 83 of the multiplication register unit 40H.

Tenth Embodiment

Figure 12:
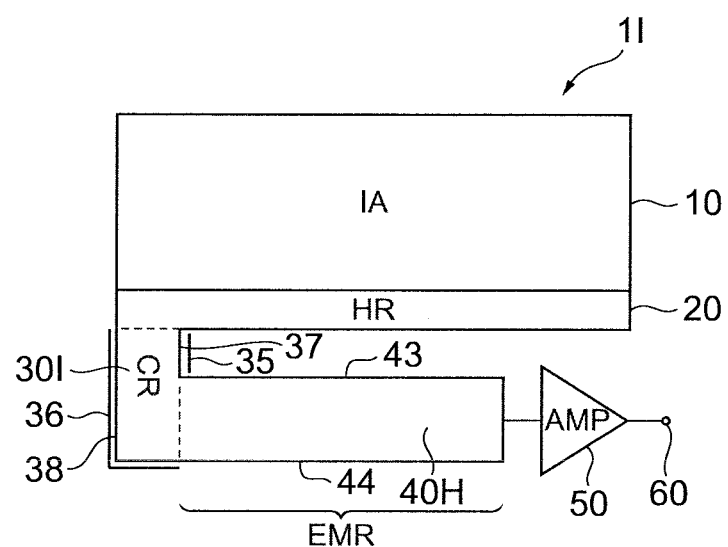
FIG. 12 is a diagram showing a configuration of a solid-state imaging device according to a tenth embodiment of the present invention.

FIG. 12 is a diagram showing a configuration of a solid-state imaging device according to a tenth embodiment of the present invention. The solid-state imaging device 1I shown in FIG. 12 is different from the ninth embodiment in an aspect of the configuration including a corner register unit 30I in place of the corner register unit 30H in the solid-state imaging device 1H. Other aspects of the configuration of the solid-state imaging device 1I are the same as those of the solid-state imaging device 1H.

The corner register unit 30I is different from the corner register unit 30H in having charge dispersion units 35 and 36 in place of the charge dispersion units 31 in the corner register unit 30H.

The charge dispersion unit 35 is a drive electrode at the side of a side portion 37 where a transfer charge is concentrated, and the charge dispersion unit 36 is a drive electrode at the side of the other side portion 38, that is, the side portion 38 where the density of transfer charge is low. As a result of a drive clock voltage greater than that to the charge dispersion unit 35 being input to the charge dispersion unit 36, a charge induction effect at the side of the side portion 38 where the density of transfer charge is low can be increased. Accordingly, the transfer charge concentrated to the side of the side portion 37 can be dispersed to the side of the side portion 38, that is, in the width direction. In addition, the charge dispersion units 35 and 36 may serve also as electrodes for normal charge transfer in the corner register unit 30I.

Thus, according to the solid-state imaging device 1I of the tenth embodiment, a transfer charge concentrated to the side of the side portion 37 of the corner register unit 30I can be dispersed by the charge dispersion units 35 and 36 to the side portion 38 where the charge density low, that is, in the width direction, so that the charge can be dispersed in the width direction before being input to the charge register unit 40H. Therefore, also in the solid-state imaging device 1I of the tenth embodiment, similar advantages to those of the solid-state imaging device 1 of the first embodiment can be obtained.

In addition, charge dispersion units (drive electrodes) similar to the charge dispersion units 35 and 36 may be formed in the multiplication register unit 40H. That is, the charge dispersion units (drive electrodes) may be formed at both side portions 43 and 44 of the multiplication register unit 40H, and a drive clock voltage greater than that to the charge dispersion unit (drive electrode) at the side of the side portion 43 where a transfer charge is concentrated may be input to the charge dispersion unit (drive electrode) at the side of the side portion 43 where the density of transfer charge is low. Accordingly, a charge induction effect at the side of the side portion 44 where the density of transfer charge is low can be increased, so that the charge transfer concentrated to the side of the side portion 43 can be dispersed to the side portion 44, that is, in the width direction. In addition, these charge dispersion units may serve also as electrodes for normal charge transfer and charge multiplication in the corner register unit 40H.

It should be noted that the present invention is not limited to the present embodiments described above, and can be variously modified.

Figure 13:
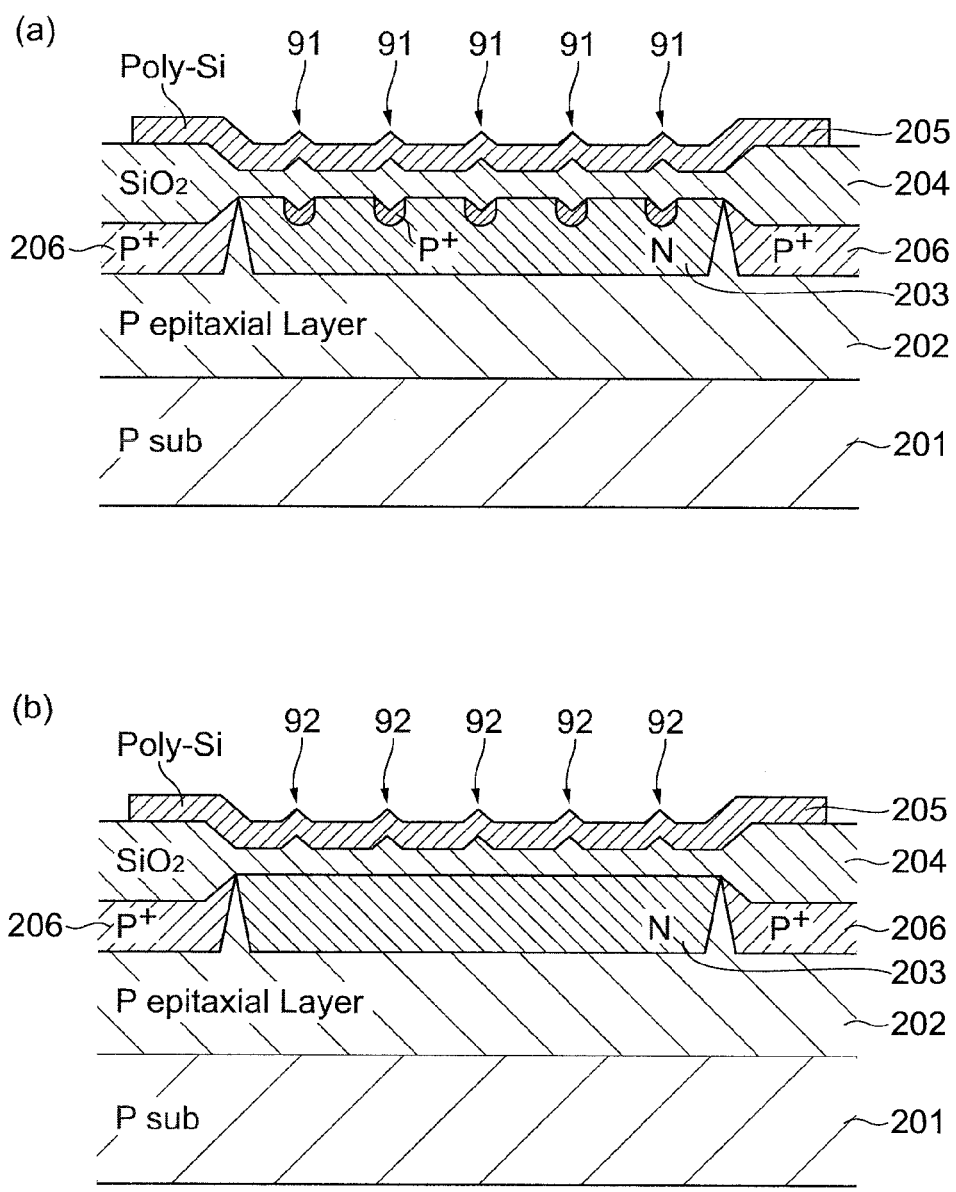
FIG. 13 includes views showing sectional views of multiplication register units of modifications of the present invention.

In the present embodiments, normal high-concentration channel stop regions were used as charge dispersion units, but to the charge dispersion units, channel stop regions 91 by a LOCOS (Local Oxidation of Silicon) method shown in FIG. 13(a), channel regions with a shallow energy potential due to a change in film thickness of a gate $SiO_2$ film shown in FIG. 13(b), that is, channel regions 92 that hinder charge transfer, and the like can be applied.

Figure 14:
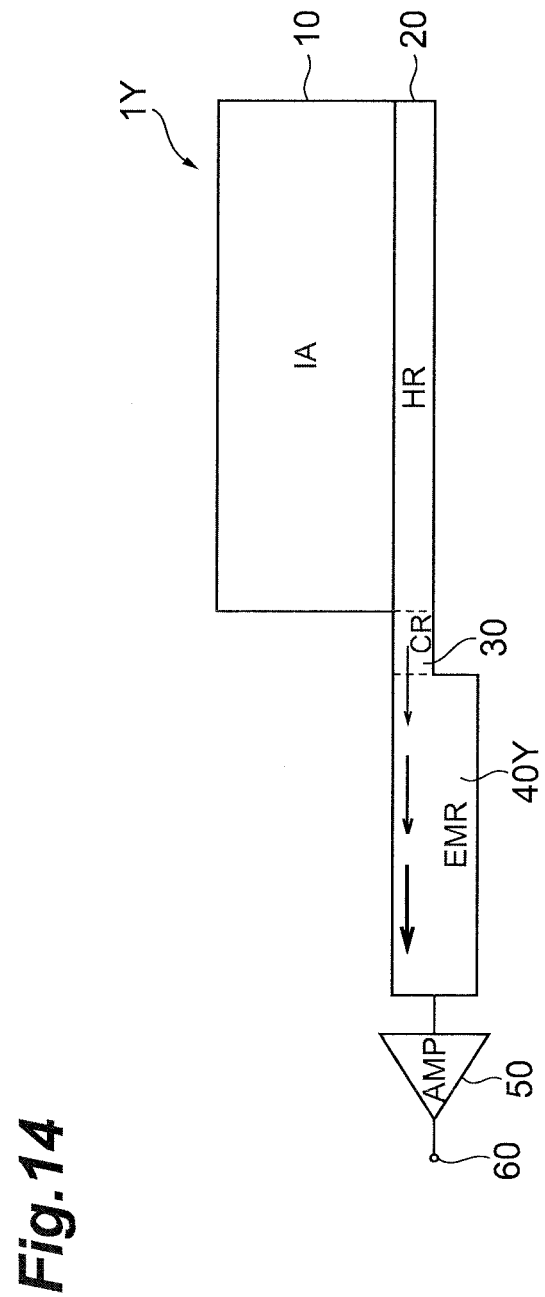
FIG. 14 is a diagram showing a configuration of a solid-state imaging device of a conventional example.

Moreover, in the present embodiments, examples of application of the charge dispersion means to the multiplication registers of the solid-state imaging device in a mode of folding back charge transfer by using the corner register unit 30 were shown, but the charge dispersion means of the present embodiment may provide similar effects even when being applied to multiplication registers of a solid-state imaging device in a mode of not folding back charge transfer. FIG. 14 shows a configuration of a solid-state imaging device of a conventional example where charge transfer is not folded back. In the solid-state imaging device 1Y of the conventional example, there is a tendency that a charge transferred from the imaging area 10 concentrates to a side closer to the imaging region of the horizontal register unit 20, so that even when a multiplication register unit 40Y is formed wide, the charge is concentrated to only a part in the width direction of the multiplication register unit 40Y (the arrow part in FIG. 14). However, by applying to this multiplication register unit 40Y the configuration of the charge dispersion units and the multiplication register unit of the present embodiment, similar effects are provided.

INDUSTRIAL APPLICABILITY

The present invention can be applied to a use for suppressing local concentration of a transfer charge in the multiplication register unit.

REFERENCE SIGNS LIST 1, 1A, 1B, 1C, 1D, 1E, 1F, 1G, 1H, 1I, 101, 101A, 101B, 101C, 101D, 101E, 101F, 101H Solid-state imaging device
10 Imaging area
20 Horizontal register unit (output register unit)
30, 30H, 30I Corner register unit (intermediate register unit)
31, 35, 36, 71, 72, 73, 75, 76, 77, 79, 81, 83, 91, 92 Charge dispersion unit (charge dispersion means)
40, 40A, 40B, 40C, 40D, 40E, 40F, 40G, 40H, 140, 140A, 140B, 140C, 140D, 140E, 140F, 140H Multiplication register unit
50 Amplifier
60 Output port

The invention claimed is:

1. A charge multiplying solid-state imaging device comprising:
   an imaging area that generates a charge according to the amount of incident light;
   an output register unit that receives the charge from the imaging area;
   a multiplication register unit that multiplies the charge from the output register; and
   at least one charge dispersion means that disperses the charge input to the multiplication register unit in a width direction perpendicular to a transfer direction, wherein
   the charge dispersion means is formed of a semiconductor region or an insulating region that is disposed at least at an input side in the multiplication register unit, and disposed in a plural number separated from each other in the width direction to hinder charge transfer, and
   the charge input to the multiplication register unit is dispersed, not via another transfer channel and not over the charge dispersion means, but to a plurality of transfer channels formed so as to disperse in the width direction, the plurality of transfer channels being formed between the charge dispersion means.

2. The solid-state imaging device according to claim 1, wherein
   the charge dispersion means includes an electrode that is disposed at a position with a low charge density in the width direction, and is for increasing a charge induction effect.

3. A charge multiplying solid-state imaging device comprising:
   an imaging area that generates a charge according to the amount of incident light;
   an output register unit that receives the charge from the imaging area;
   a multiplication register unit that multiplies the charge from the output register;
   at least one charge dispersion means that disperses the charge input to the multiplication register unit in a width direction perpendicular to a transfer direction; and
   an intermediate register unit disposed between the output register unit and the multiplication register unit, wherein
   the charge dispersion means is formed of a semiconductor region or an insulating region that is disposed at least at an output side in the intermediate register unit, and disposed in a plural number separated from each other in the width direction to hinder charge transfer, and
   the charge input to the multiplication register unit is dispersed, not via another transfer channel and not over the charge dispersion means, but to a plurality of transfer channels formed so as to disperse in the width direction, the plurality of transfer channels being formed between the charge dispersion means.

4. The solid-state imaging device according to claim 3, wherein
   the charge dispersion means includes an electrode that is disposed at a position with a low charge density in the width direction, and is for increasing a charge induction effect.

* * * * *